(12) United States Patent
Chuang et al.

(10) Patent No.: US 6,639,806 B1
(45) Date of Patent: Oct. 28, 2003

(54) MOTHERBOARD AND EXPANSION BOARD FOR PROVIDING SUCH MOTHERBOARD WITH SLOTS

(75) Inventors: Henry Chuang, Taipei (TW); Kuang-Chi Lin, Taipei (TW); Jin-Hsin Yang, Taipei (TW)

(73) Assignee: Asustek Computer Inc., Taipei (TW)

( * ) Notice: Subject to any disclaimer, the term of this patent is extended or adjusted under 35 U.S.C. 154(b) by 0 days.

(21) Appl. No.: 09/499,705

(22) Filed: Feb. 8, 2000

(30) Foreign Application Priority Data

Dec. 23, 1999 (TW) ........................................ 88221956 U

(51) Int. Cl.[7] .......................... H05K 1/00; H05K 1/18; H05K 7/02; H05K 7/06; H05K 7/08
(52) U.S. Cl. .................. 361/748; 361/752; 361/756; 361/802
(58) Field of Search ................... 361/725–733, 361/748, 752–753, 756, 759, 796–803, 736, 737, 785–786, 685; 439/61–64, 55, 79

(56) References Cited

U.S. PATENT DOCUMENTS

| | | | | |
|---|---|---|---|---|
| 4,400,049 A | * | 8/1983 | Schuck | 339/176 MP |
| 4,498,717 A | * | 2/1985 | Reimer | 361/788 |
| 5,648,891 A | * | 7/1997 | Gierut | 361/788 |
| 5,793,620 A | * | 8/1998 | Burnworth et al. | 361/818 |
| 6,259,600 B1 | * | 7/2001 | Talbot et al. | 361/687 |
| 6,261,104 B1 | * | 7/2001 | Leman | 439/61 |

* cited by examiner

*Primary Examiner*—Kamand Cuneo
*Assistant Examiner*—Tuan Dinh
(74) *Attorney, Agent, or Firm*—Rabin & Berdo, PC

(57) ABSTRACT

The invention is to provide a motherboard assembly including a motherboard complying with a first industry standard specification and an expansion board for providing the motherboard with at least one slot. The expansion board is detachably connected to the motherboard. In particular, when the expansion board is connected to the motherboard, the motherboard assembly complies with a second industry standard specification. Moreover, the first and second industry standard specifications have a position compatibility. The expansion board also provides with the slot following an interface specification which the motherboard does not follows. The motherboard assembly, according to the invention, can reduce cost thereof during design, manufacture, maintain and test.

5 Claims, 5 Drawing Sheets

MOTHERBOARD AND EXPANSION BOARD FOR PROVIDING SUCH MOTHERBOARD WITH SLOTS

FIELD OF THE INVENTION

The present invention relates to a motherboard and an expansion board for providing the motherboard with at least one slot and, more in particular, to a motherboard complying with a first industry standard specification and an expansion board detachably connected to an edge of the motherboard such that the motherboard and expansion board constitute a motherboard assembly complying with a second industry standard specification when the motherboard and expansion board connect together.

Related prior arts refer to as follows: the PCI-Riser standard specification of motherboard established by Sony Corp.; the NLX standard specification of motherboard established by Microsoft Corp.; and the ATX, MicroATX and FlexATX standard specifications of motherboard established by Intel Corp.

BACKGROUND OF THE INVENTION

The current development for desktop computers gravitate towards the compact and light-weight in order to diminish manufacture cost and power consumption of the computers. Thereby, users can buy cheaper and more compact personal computers. Following the development trend of personal computers, the current development for specification of motherboard also gravitates towards the compact. For example, Intel Corp. early establishes the AXT standard specification, and later establishes the MicroATX and Flex-ATX standard specifications based on the consideration of position compatibility and dimension diminishing of motherboards of the AXT specification.

Figure 1:
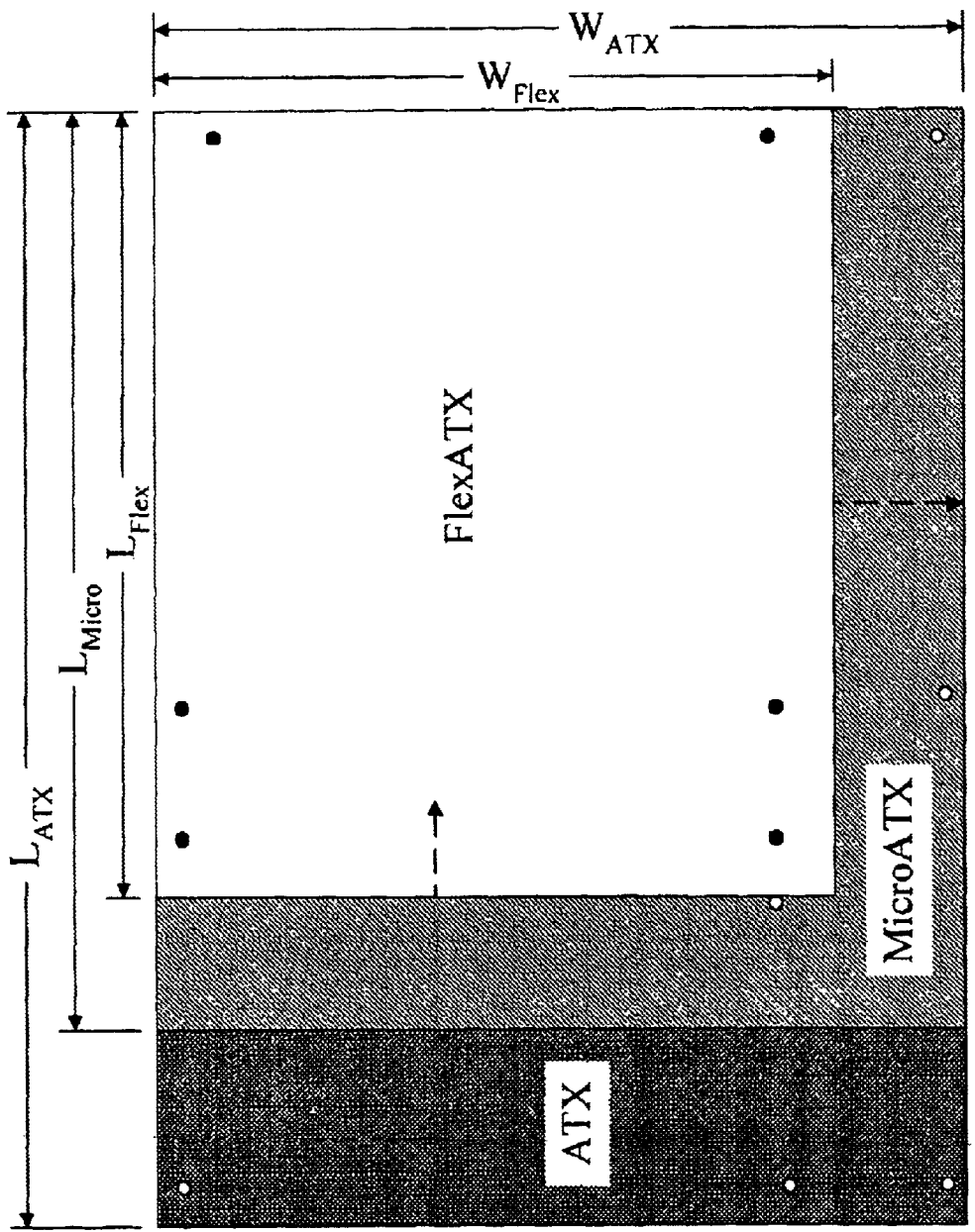

Referring to FIG. 1, the dimension difference between the motherboards respectively complying with the ATX, MicroATX and FlexATX specifications is shown. As shown in FIG. 1, the dimension of the motherboard complying with the FlexATX specification is the smallest (as the area marked FlexATX shown in FIG. 1), the dimension of the motherboard complying with the MicroATX specification is the next largest (as the area including the area marked FlexATX and the area with oblique lines shown in FIG. 1), and the dimension of the motherboard complying with the ATX specification is the largest (as the area including the area marked FlexATX, the area with oblique lines and area with cross lines).

Also shown in FIG. 1, the length $L_{ATX}$ and width $W_{ATX}$ of the motherboard of the ATX specification are the longest and the widest, respectively. The length $L_{Micro}$ of the motherboard of the MicroATX specification is shorter than that of the motherboard of the ATX specification, and the width of the motherboard of the MicroATX specification is the same as that of the motherboard of the ATX specification. The length $L_{Flex}$ of the motherboard of the FlexATX specification is shorter than that of the motherboard of the MicroATX specification, and the width $W_{Flex}$ of the motherboard of the FlexATX specification is more narrow than those of the motherboards of the ATX and MicroATX specifications. In particular, the dimension of the motherboard complying with the FlexATX specification is variable. That is the length of the motherboard of the FlexATX specification can be reduced more as desired, and the width of the motherboard of the FlexATX specification can be extended to be the same as that of the motherboard of the ATX specification.

In addition, the aforesaid motherboards also require the position of mounting holes on the motherboard, where the mounting holes of the motherboard are provided for mounting the motherboard on the inner wall of a matched case. As shown in FIG. 1, white circles denote the position of mounting holes formed on the motherboard complying with the ATX or MicroATX specifications, and black circles denote the position of mounting holes formed on the motherboard complying with the FlexATX specification. Thereby, the motherboard of the FlexATX specification can be mounted within a case matching the motherboard of the MircoATX or ATX specifications, and the motherboard of the MicroATX specification can be arranged within a case matching the motherboard of the ATX specification.

However, the trend of desktop computers towards the compact also brings about a negative effect, i.e., useable I/O slots provided by the compact motherboard are decreased relatively. When a user needs more slots than those provided by the compact motherboard to install expansion devices such as interface cards, he inevitably requires the assistance of an expansion apparatus for increasing the I/O slots of the compact motherboard. Prior arts regarding type, connecting manner and connecting position of an expansion apparatus for providing a motherboard with slots will be described as follows.

Figure 2:
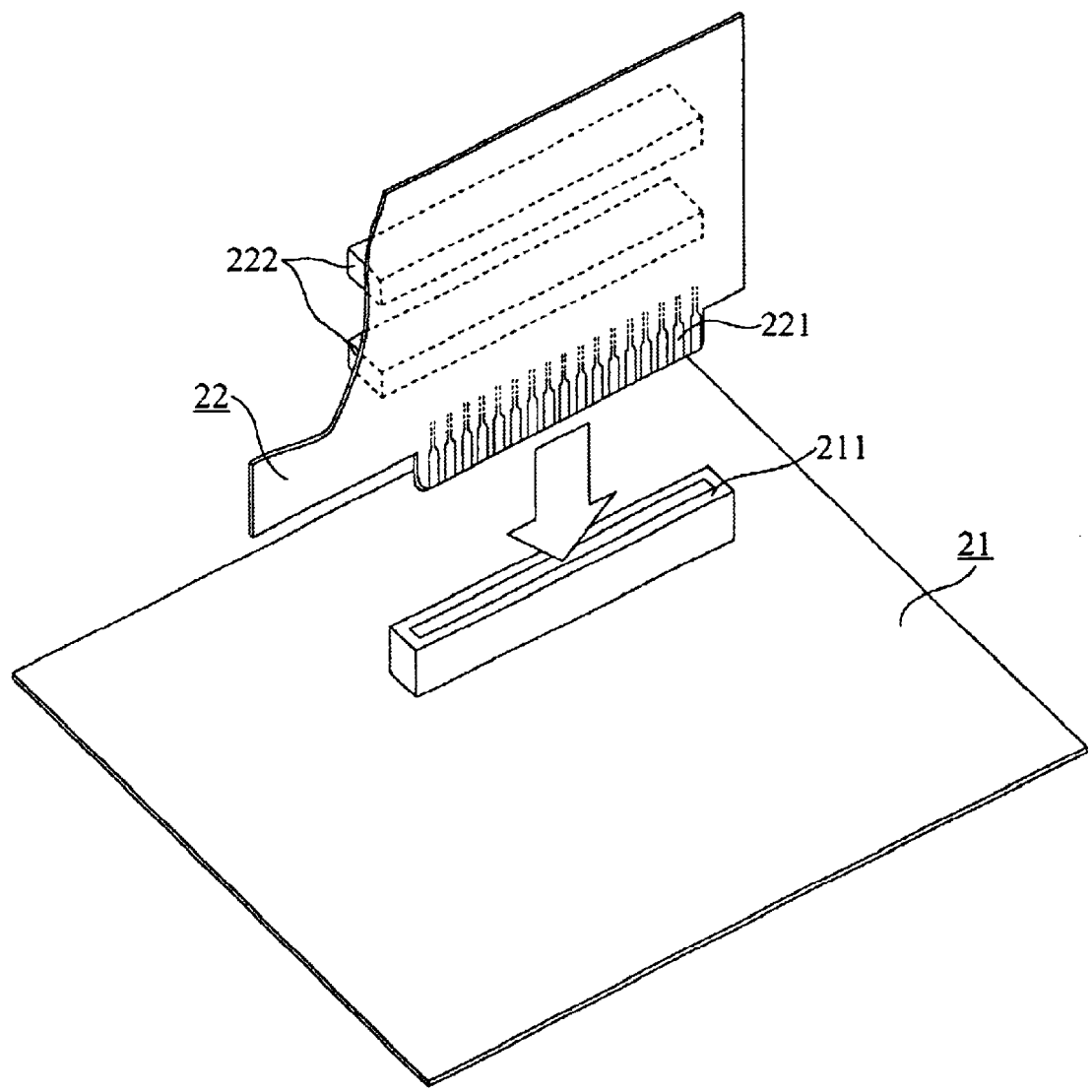

Referring to FIG. 2, according to Sony's PCI-Riser standard specification, a motherboard 21 and an expansion board 22 of a riser type is provided on the motherboard 21 to provide additional slots 222. The connection relationship between the motherboard 21 and the expansion board 22 is also shown in FIG. 2. The motherboard 21 of the PCI-Riser specification is a compact motherboard. Thus, only one slot 211 is provided on the motherboard 21. According to the PCI-Riser specification, when the motherboard 21 requires additional slots, the expansion board 22 is inserted into the slot 211 initially provided on the motherboard 21 via a bus 221 of a golden-finger type to provide the motherboard 21 with the additional slots 222. Obviously, when the motherboard 21 and the expansion board 22 are connected together, the slot 211 provided on the motherboard 21 is inevitably sacrificed so that the slot 211 cannot provide for the insertion of an interface card. Besides, note that the motherboard 21 and the expansion board 22 are disposed perpendicularly from each other when they connect together.

Similarly, according to Intel's FlexATX specification, when the motherboard of the FlexATX specification requires additional slots, an expansion board of a riser type can be inserted into a slot initially provided on the motherboard to provide the motherboard with the additional slots.

Figure 3:
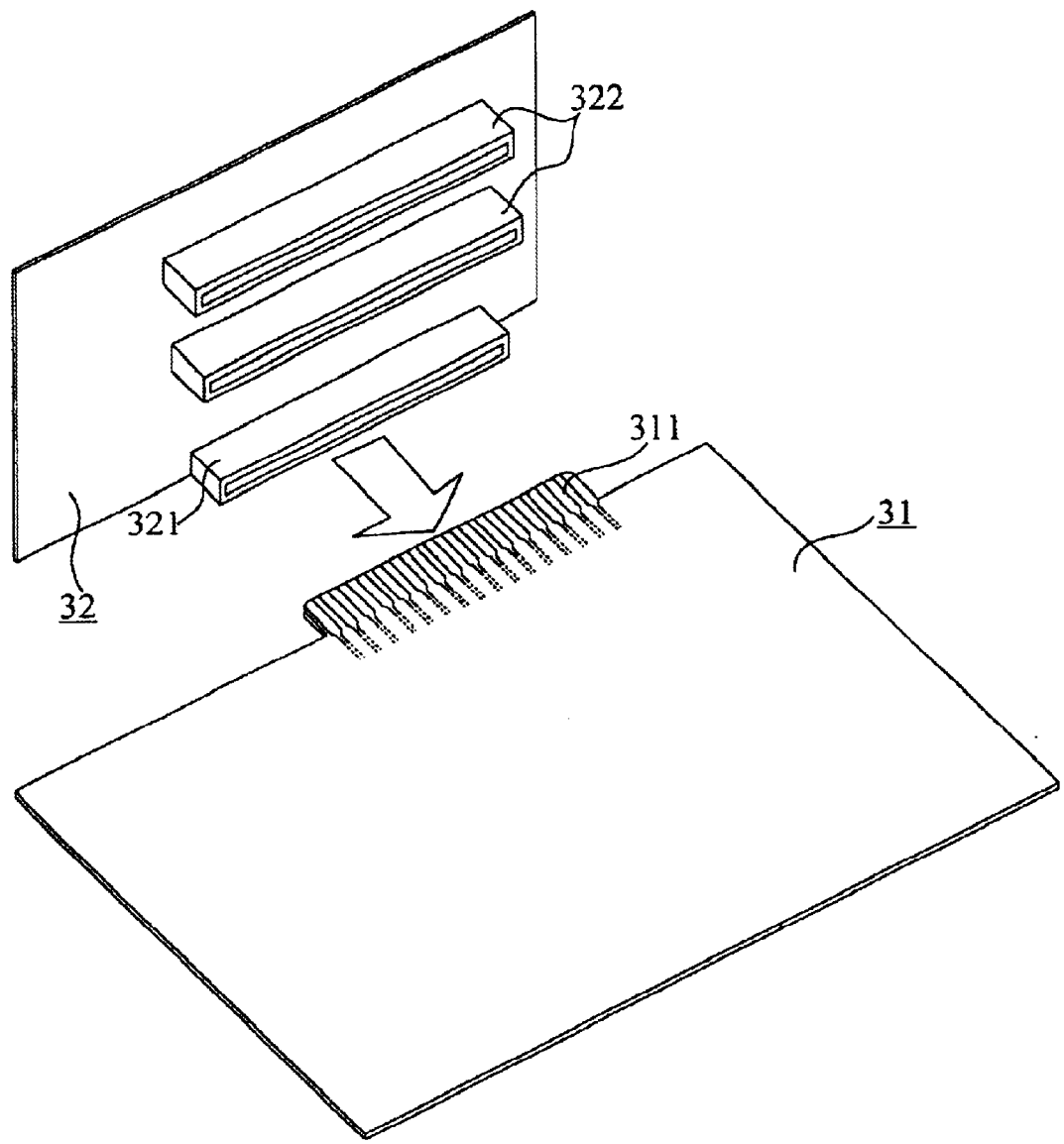

Referring to FIG. 3, according to Microsoft's NLX standard specification, an expansion board 32 is provided on the motherboard 31 to provide for additional slots 322. The connection relationship between the motherboard 31 and the expansion board 32 is also shown in FIG. 3. The motherboard 31 of the NLX specification is a compact motherboard. The motherboard 31 is provided with a bus 311 of a golden-finger type at an edge of itself. According to the NLX specification, when the motherboard 31 requires additional slots, the expansion board 32 is connected to the bus 311 via a connector 321 of itself. Note that the motherboard 31 and the expansion board 32 are disposed perpendicularly from each other when they connect together.

However, through the description of prior arts, it is obvious that, to date, no expansion board for providing a motherboard with slots is connected in parallel to an edge of the motherboard. That is, to date, no expansion board for providing a motherboard with slots is disposed in parallel with the motherboard when they connect together.

Accordingly, the invention is motivated towards providing an expansion board detachably connected in parallel to an edge of a motherboard. By the expansion board according to the invention, a motherboard with a little dimension can be extended to be a motherboard assembly with a large dimension such that the motherboard assembly can be arranged within a case matching a motherboard with a dimension the same as that of the motherboard assembly. This approach of the invention really manifests the advantage of compatibility between motherboards of various specifications. With the invention, if one user considers future expansibility of a computer at the time buying the computer, he can buy a case with a large dimension and a motherboard, according to the invention, with a little dimension to constitute the computer as desired. Further, the user can connect an expansion board according to the invention to an edge of such motherboard to make full use of the space of the case if needed. The user, who has bought a computer including a case and a motherboard with a large dimension, can update the computer, if needed, only by replace the motherboard with the large dimension by a motherboard, according to the invention, with a little dimension to reserve the future compatibility of the updated computer.

In addition, on aspects of designer and manufacturer, if designer and manufacturer develop a motherboard with a large dimension into a motherboard assembly, that is, including a motherboard with a little dimension and an expansion board according to the invention, they only modify the motherboard with the little dimension without the need to vary the configuration of the expansion board when a motherboard device on the motherboard, such as a CPU or a chipset, needs to be upgraded. Obviously, this approach can give the motherboard with convenience for design and manufacture, and conform to the requirement for reducing the cost of computer corresponding to the trend of low price computer.

Besides, most of present-day motherboards need to include the industry standard interface specifications that current expansion devices still follow, e.g., the ISA interface specification, the PCI interface specification, the AGP interface specification, the USB interface specification, the AMR interface specification, etc. However, as the development of desktop computers gravitate towards the compact, the expansibility of the computers is sacrificed. Accordingly, another objective of the invention is to provide a motherboard complying with a first specification and an expansion board for providing the motherboard with slots. In particular, an interface specifications, which one of the slots provided by the expansion board follows, is not followed by the motherboard. Obviously, this approach can increase the expansibility of the motherboard.

SUMMARY OF THE INVENTION

It is an objective of the invention to provide a motherboard complying with a first industry standard specification and an expansion board for providing the motherboard with at least one slot. In particular, the expansion board is detachably and connected in parallel with the motherboard. The expansion board and the motherboard constitute a motherboard assembly complying with a second industry standard specification when they connect together. Moreover, there is a position compatibility existing between the first specification and the second specification. Whether or not the motherboard connects with the expansion board, the motherboard (or the motherboard assembly) can be installed within a case matching a motherboard of the second specification and, thereby, the advantage of the compatibility between the motherboards of the first and second specifications can be manifested.

It is another objective of the invention is to provide a motherboard complying with a first industry standard specification and an expansion board for providing the motherboard with at least one slot. In particular, an interface specification, which one of the slots provided by the expansion board follows, is not followed by the motherboard and, thereby, the expansion board can increase the expansibility of the motherboard.

According to a first preferred embodiment of the invention, a motherboard assembly includes a motherboard complying with first industry standard specification and an expansion board for providing the motherboard with at least one slot. The expansion board is detachably connected to the motherboard. When the expansion board is connected to the motherboard, the motherboard assembly complies with a second industry standard specification. In an embodiment, the first industry standard specification is the FlexATX specification, and the second industry standard specification is the MicroATX specification. In another embodiment, the first industry standard specification is the MicroATX specification, and the second industry standard specification is the ATX specification.

According to a second preferred embodiment of the invention, a motherboard assembly selectively complies with a first industry standard specification, a second industry standard specification and a third industry standard specification. The motherboard assembly includes a motherboard complying with the first industry standard specification, a first expansion board, detachably connected to the motherboard, for providing at least one first slot, and a second expansion board, detachably connected to the first expansion board, for providing at least one second slot. When the first expansion board is connected to the motherboard, the motherboard assembly complies with the second industry standard specification. When the second expansion board is connected to the first expansion board and the first expansion board is connected to the motherboard at the same time, the motherboard assembly complies with the third industry standard specification. In an embodiment, the first industry standard specification is the FlexATX specification, the second industry standard specification is the MicroATX specification, and the third industry standard specification is the ATX specification.

The advantages and spirit of the invention will be rendered more comprehensible by the following recitations accompanied by the appended drawings.

BRIEF DESCRIPTION OF THE APPENDED DRAWINGS

FIG. 1 is a diagram schematically showing the dimension difference between the motherboards complying the ATX, MicroATX and FlexATX specifications, respectively.

FIG. 2 schematically shows a motherboard 21 complying with Sony's PCI-Riser specification and an expansion board 22 for providing the motherboard 21 with additional slots 222, and also shows the connection relationship between the motherboard 21 and the expansion board 22.

FIG. 3 schematically shows a motherboard 31 complying with Microsoft's NLX specification and an expansion board 32 for providing the motherboard 31 with additional slots 322, and also shows the connection relationship between the motherboard 31 and the expansion board 32.

Figure 4:
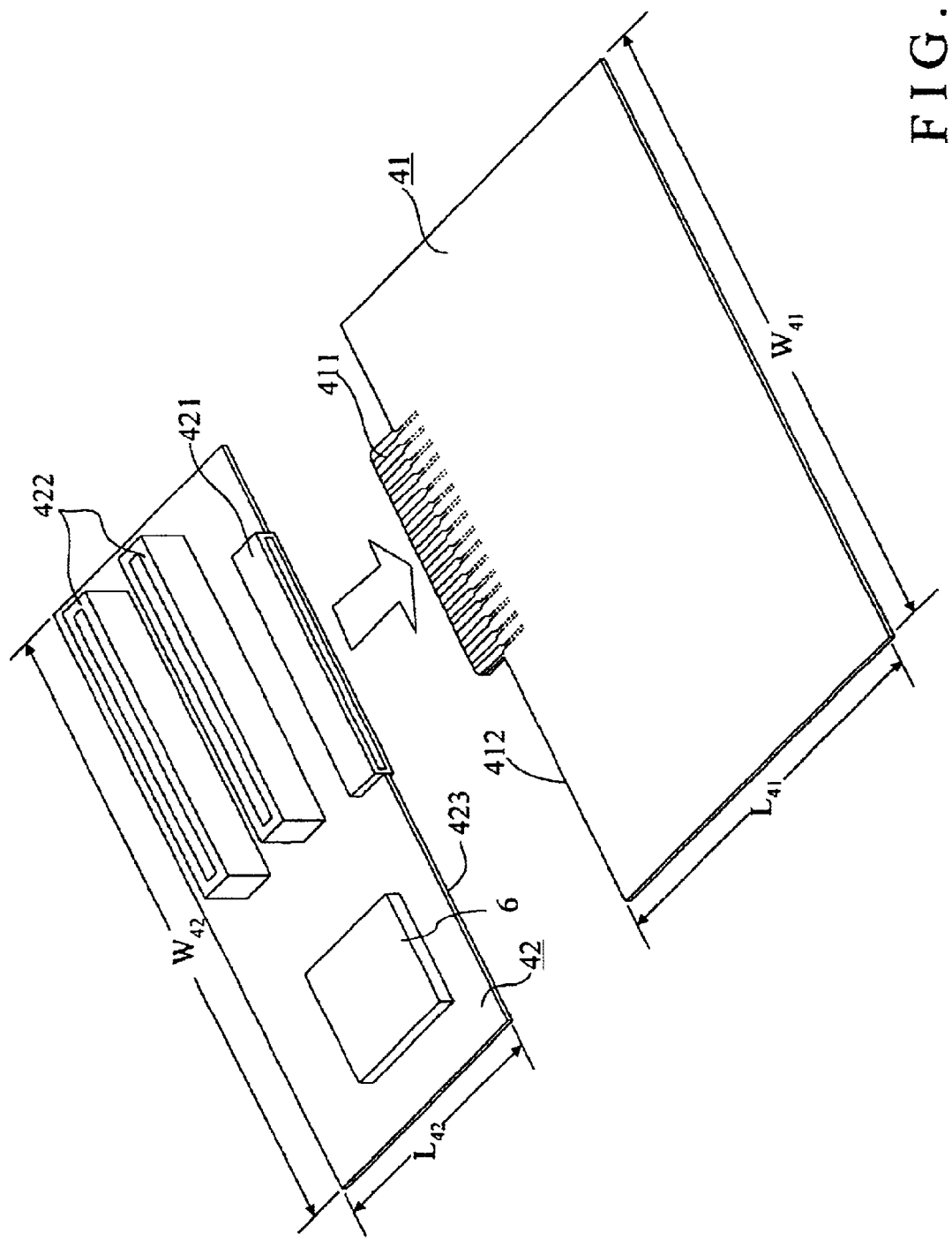

FIG. 4 shows a motherboard 41 and an expansion board 42 for providing the motherboard 41 with at least one slot 422 in accordance with the first preferred embodiment of the invention.

Figure 5:
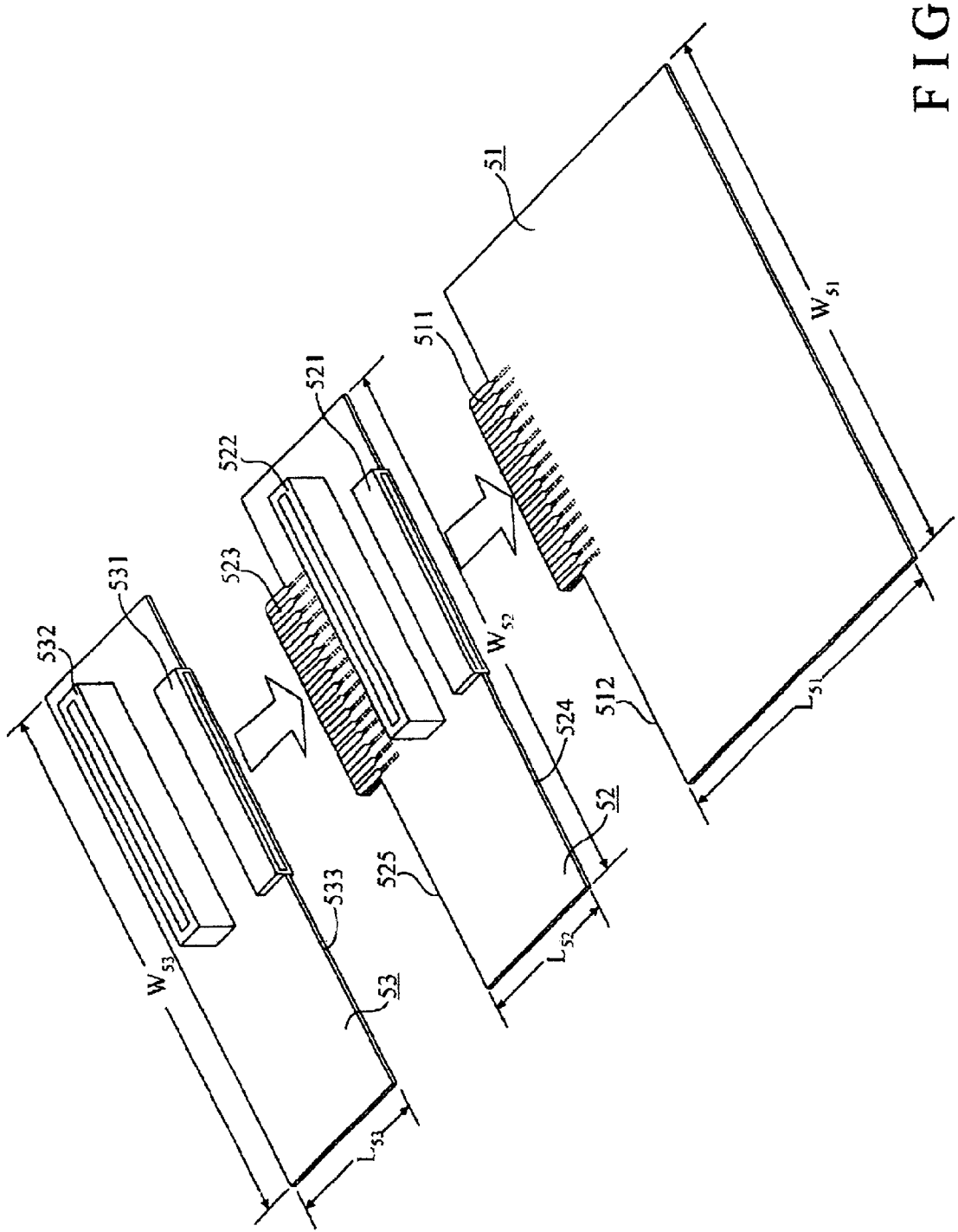

FIG. 5 shows a motherboard 51, a first expansion board 52 for providing at least one slot 522, and a second expansion board 53 for providing at least one second slot 532 in accordance with the second preferred embodiment of the invention.

DETAILED DESCRIPTION OF THE INVENTION

The present invention provides a motherboard complying with a first industry specification and an expansion board for providing the motherboard with at least one slot. In particular, the expansion board is capable of connecting in parallel with the motherboard so as to assemble into a motherboard assembly complying with a second industry standard specification. Whether or not the motherboard connects with the expansion board, the motherboard (or the motherboard assembly) can be installed within a case matching a motherboard of the second specification and, thereby, the advantage of the compatibility between the motherboards of the first and second specifications can be manifested. It is obvious that this approach gives one user with much convenience when he needs to buy or expand a computer system. This approach also gives the motherboard with much convenience on manufacture and design such that the manufacturing cost of the motherboard can be reduced.

In the following detailed description of the present invention, several preferred embodiments are set forth in order to provide a thorough understanding of the present invention.

Referring to FIG. 4, a motherboard assembly according to a first preferred embodiment of the invention is disclosed. The motherboard assembly includes a motherboard 41 complying with a first industry standard specification and an expansion board 42 for providing the motherboard 41 with at least one slot 422. The expansion board 42 is detachably connected with the motherboard 41. In particular, the motherboard assembly complies with a second industry standard specification when the motherboard 41 connects with the expansion board 42 together.

For the purposes of connecting the motherboard 41 and the expansion board 42, the motherboard 41, at a first edge 412 thereof, is provided with a first connection device 411, and the expansion board 42, at a second edge 423 thereof, is provided with a second connection device 421 for making connection thereof to the first connection device 411. When the expansion board 42 is connected to the motherboard 41, the second edge 423 is adjacent to the first edge. This can also enhance the support of the motherboard 41 for the expansion board 42 when the motherboard 41 and the expansion board 42 connect together.

In an embodiment, the first industry standard specification is the FlexATX specification, and the second industry standard specification is the MicroATX specification. That is the length $L_{41}$ of the motherboard 41 conforms to the length $L_{Flex}$ established in the FlexATX specification, and the length combining the length $L_{41}$ of the motherboard 41 and the length $L_{42}$ of the expansion board 42 conforms to the length $L_{Micro}$ established in the MicroATX specification. Moreover, the width $W_{41}$ of the motherboard 41 and the width $W_{42}$ of the expansion board 42 both conform to the width $W_{ATX}$ established in the ATX specification (or the MicroATX specification).

In another embodiment, the first industry standard specification is the MicroATX specification, and the second industry standard specification is the ATX specification. That is the length $L_{41}$ of the motherboard 41 conforms to the length $L_{Micro}$ established in the MicroATX specification, and the length combining the length $L_{41}$ of the motherboard 41 and the length $L_{42}$ of the expansion board 42 conforms to the length $L_{ATX}$ established in the ATX specification. Moreover, the width $W_{41}$ of the motherboard 41 and the width $W_{42}$ of the expansion board 42 both conform to the width $W_{ATX}$ established in the ATX specification.

In an embodiment, the first connection device 411 is a bus of a golden-finger type, and the second connection device 421 is a female connector adapted to the bus of the golden-finger type, as shown in FIG. 4.

In another embodiment, the first connection device 411 is a male connector, and the second connection device 421 is a female connector adapted to the aforesaid male connector.

In another embodiment, the second connection device 421 is a male connector, and the first connection device 411 is a female connector adapted to the aforesaid male connector.

In an embodiment, the connection device 411 includes the buses and signal lines employed in a general computer system, such as the ISA bus, the PCI bus, the AGP bus, the USB bus, the AMR bus, the I2C bus/SMBUS series interface, the LPC (Low Pin Count), the hardware monitor control/sensor signal, power, etc.

The invention also provides a motherboard complying with a first industry standard specification and an expansion board for providing the motherboard with at least one slot. In particular, an interface specification, which one of the slots provided by the expansion board follows, is not followed by the motherboard and, thereby, the expansion board can increase the expansibility of the motherboard. To achieve the purpose, in an embodiment, the first connection device 411 and the second connection device 421 include a first bus, respectively. The slots 422 includes a slot following a second bus. The expansion board 42 further includes a conversion device 6 for performing the conversion between the first bus and the second bus. For example, the first bus is the PCI bus, the second bus is the ISA, and thus the conversion device is for performing the conversion between the PCI bus and the ISA bus. This approach can make the connection of the motherboard 41 to the expansion devices with the buses that the motherboard 41 does not follow. In addition, the buses designed into the first and connection devices (411 and 421) can be decreased to reduce the manufacture cost of the motherboard 41.

Referring FIG. 5, a motherboard assembly according to a second preferred embodiment of the invention is disclosed. The motherboard assembly selectively complies with a first industry standard specification, a second industry standard specification and a third industry standard specification. The motherboard assembly includes a motherboard 51 complying with the first industry standard specification, a first expansion board 52 for providing at least one first slot 522, and a second expansion board 53 for providing at least one second slot 532. The first expansion board 52 is detachably connected to thee motherboard 51. Moreover, when the first expansion board 52 is connected to the motherboard 51, the motherboard assembly complies with the second industry standard specification. The second expansion board 53 is detachably connected to the first expansion board 52. Moreover, when the second expansion board 53 is connected to the first expansion board 52 and the first expansion board 52 is connected to the motherboard 51 at the same time, the motherboard assembly complies with the third industry standard specification.

For the purposes of connecting the motherboard 51 and the first expansion board 52 and connecting the first expansion board 52 and the second expansion board 53, the motherboard 51, at a first edge 512 thereof, is provided with a first connection device 511, and the first expansion board 52, at a second edge 524 thereof, is provided with a second connection device 521 for making connection thereof to the first connection device 511. The first expansion board 52, at a third edge 525 thereof, is also provided with a third connection device 523, and the second expansion board 53, at a fourth edge 533 thereof, is provided with a fourth connection device 531 for making connection thereof to the third connection device 523. When the first expansion board 52 is connected to the motherboard 51, the second edge 524 is adjacent to the first edge 512. When the second expansion board 53 is connected to the first expansion board 52, the fourth edge 533 is adjacent to the third edge 525.

In an embodiment, the first industry standard specification is the FlexATX specification, the second industry standard specification is the MicroATX specification, and the third industry standard specification is the ATX specification. That is the length $L_{51}$ of the motherboard 51 conforms to the length $L_{Flex}$ established in the FlexATX specification, the length combining the length $L_{51}$ of the motherboard 51 and the length $L_{52}$ of the first expansion board 52 conforms to the length $L_{Micro}$ established in the MicroATX specification, and the length combining the length $L_{51}$ of the motherboard 51 with the length $L_{52}$ of the first expansion board 52 and the length $L_{53}$ of the second expansion board 53 conforms to the length $L_{ATX}$ established in the ATX specification. Moreover, the width $W_{51}$ of the motherboard 51, the width $W_{52}$ of the first expansion board 52 and the width $W_{53}$ of the second expansion board 53 all conform to the width $W_{ATX}$ established in the ATX specification.

In an embodiment, the first connection device 511 and the third connection device 523 are a bus of a golden-finger type, respectively. The second connection device 521 and the fourth connection device 531 are a female connector adapted to the bus of the golden-finger type, respectively, as shown in FIG. 5.

In another embodiment, the first connection device 511 and the third connection device 523 are a male connector, respectively. The second connection device 521 and the fourth connection device 531 are a female connector adapted to the aforesaid male connector, respectively.

In another embodiment, the second connection device 521 and the fourth connection device 531 are a male connector, respectively. The first connection device 511 and the third connection device 523 are a female adapted to the aforesaid male connector, respectively.

In an embodiment, the first connection device 511 and the second connection device 521 include a first bus, respectively. The slots 522 includes a slot following a second bus. The first expansion board 52 further includes a conversion device (not shown) for performing the conversion between the first bus and the second bus.

In addition, the expansion board of the invention can be replaced by a test apparatus for testing the motherboard of the invention by using the buses and signal lines providing on in the first connection device of the motherboard. Obviously, the motherboard according the invention can give convenience when it is tested by using the aforesaid test apparatus.

To sum up, the distinct features and advantages of the present invention are listed as follows:

1. when the motherboard and the expansion board, according to the invention, connect together, they are parallel from each other rather than perpendicular from each other;
2. the motherboard, according to the invention, complies with a first industry standard specification, and combines with an expansion board into a motherboard assembly complying with a second industry standard specification such that the motherboard and the motherboard assembly both can be arranged within a case matching a motherboard of the second specification to manifest the advantage of compatibility between the motherboards of the first and second specifications;
3. the motherboard and the expansion board, according to the invention, can be designed and manufactured into the motherboard assembly and, thereby, only the motherboard needs to be modified without the need to vary the configuration of the expansion board when a motherboard device on the motherboard needs to be upgraded;
4. according to the invention, an interface specification, which one of the slots provided by the expansion board follows, is not followed by the motherboard and, thereby, the expansion board can increase the expansibility of the motherboard;
5. according to the invention, the expansion board can be replaced by a test apparatus for testing the motherboard by the buses and signal lines provided in the first connection of the motherboard; and
6. according to the invention, the cost of the motherboard can be reduced during design, manufacture, maintain and test.

While the invention has been described in some preferred embodiments, it is understood that the words which have been used are words of description rather than words of limitation and that changes within the purview of the appended claims may be made without departing from the scope and spirit of the invention in its broader aspect.

What is claimed is:

1. A motherboard assembly, comprising:
    a motherboard complying with one of a FlexATX specification and a MicroATX specification; and
    an expansion board, detachably connected to said motherboard, and having at least one slot;
    wherein when said expansion board is connected to said motherboard, said motherboard and said expansion board are arranged in a coplanar fashion so that said motherboard assembly complies with one of the MicroATX specification and an ATX specification when said motherboard complies with the FlexATX specification, and complies with the ATX specification when said motherboard complies with the MicroATX specification,
    wherein said motherboard, at a first edge thereof, is provided with a first connection device, and said expansion board, at a second edge thereof, is provided with a second connection device for making connection thereof to the first connection device, and
    wherein the first connection device and second connection device comprise a first bus, respectively, the at least one slot comprises a slot of a second bus, and said expansion board further comprises a conversion means for performing a conversion between the first bus and a second bus.

2. The motherboard assembly of claim 1, wherein when said expansion board is connected to said motherboard, the second edge is adjacent to the first edge.

3. A motherboard assembly selectively complying with one of a FlexATX specification, a MicroATX specification and an ATX specification, said motherboard assembly comprising:

a motherboard having the FlexATX specification;

a first expansion board, detachably connected to said motherboard, and having at least one first slot, wherein when said first expansion board is connected to said motherboard, said motherboard assembly has the MicroATX specification; and a second expansion board, detachably connected to said first expansion board, for providing at least one second slot, wherein when said second expansion board is connected to said first expansion board and said first expansion board is connected to said motherboard at the same time, said motherboard, said first expansion board and said second expansion board are arranged in a coplanar fashion, and said motherboard assembly has the ATX specification, wherein said motherboard, at a first edge thereof, is provided with a first connection device, and said first expansion board, at a second edge thereof, is provided with a second connection device for making connection thereof to the first connection device, and wherein said first expansion board, at a third edge thereof, is provided with a third connection device on the third edge thereof, and said second expansion board, at a fourth edge thereof, is provided with a fourth connection device for making connection thereof to the third connection device.

4. The motherboard assembly of claim 3, wherein when said first expansion board is connected to said motherboard, the second edge is adjacent to the first edge, and wherein when said second expansion board is connected to said first expansion board, the fourth edge is adjacent to the third edge.

5. The motherboard assembly of claim 3, wherein the first connection device and second connection device comprise a first bus, respectively, the at least one first slot comprises a slot of a second bus, and said first expansion board further comprises a conversion means for performing a conversion between the first bus and a second bus.

* * * * *